United States Patent [19]

Kasahara et al.

[11] Patent Number: 5,065,044
[45] Date of Patent: Nov. 12, 1991

[54] METHOD FOR DRIVING A PNPN SEMICONDUCTOR DEVICE

[75] Inventors: Kenichi Kasahara; Ichiro Ogura; Yoshiharu Tashiro, all of Tokyo, Japan

[73] Assignee: NEC Corporation, Japan

[21] Appl. No.: 426,303

[22] Filed: Oct. 24, 1989

[30] Foreign Application Priority Data

Oct. 25, 1988 [JP] Japan ................... 63-269726

[51] Int. Cl.$^5$ ............... H01L 33/00; H01L 29/74; H03K 3/42; H03K 3/26
[52] U.S. Cl. ........................... 307/324; 357/17; 307/311; 350/320
[58] Field of Search ............ 357/17, 38 LA; 307/311, 307/324; 350/320

[56] References Cited

PUBLICATIONS

"SCR Manual" Third Edition, General Electric, p. 7.
"Double Heterostructure Optoelectronic Switch as a Dynamic Memory with Low-Power Consumption", by K. Kasahara et al., Appl. Phys. Lett., vol. 52, Feb. 29, 1988, pp. 679-681.

Primary Examiner—Rolf Hille
Assistant Examiner—Wael Fahmy
Attorney, Agent, or Firm—Ostrolenk, Faber, Gerb & Soffen

[57] ABSTRACT

At least one electric pulse having a predetermined voltage which is higher than a switching voltage for a pnpn semiconductor device and a predetermined width is applied across the pnpn semiconductor device. The electric pulse width is set not to turn the pnpn semiconductor device on. Consequently, a predetermined amount of carriers are accumulated in the pnpn semiconductor device. In this circumstance, a trigger light is supplied to the pnpn semiconductor device to be turned on. As a result, an energy of the trigger light is largely decreased as compared to a conventional method.

3 Claims, 9 Drawing Sheets

FIG. I PRIOR ART

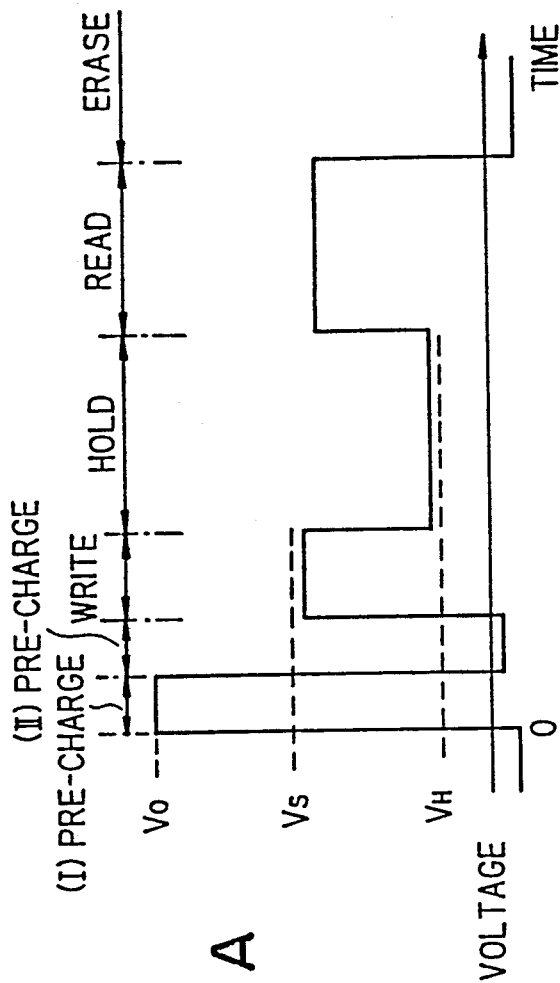
FIG. 10A
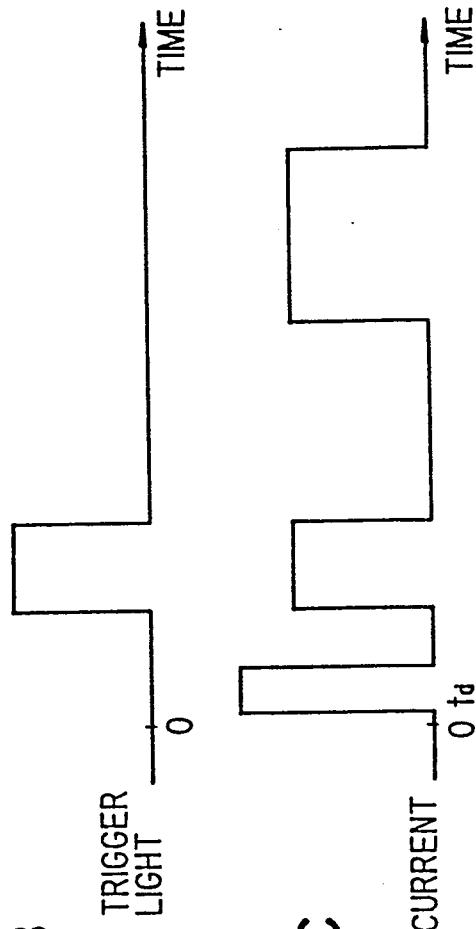
FIG. 10B
FIG. 10C

METHOD FOR DRIVING A PNPN SEMICONDUCTOR DEVICE

FIELD OF THE INVENTION

This invention relates to a method for driving a pnpn semiconductor device and more particularly, to a method for driving a pnpn semiconductor device applied to optical information processing apparatus, and the like.

BACKGROUND OF THE INVENTION

It is well known that a semiconductor device having a pnpn structure is shifted between the two states of the low impedance and the high impedance with respect to an internal impedance. Such a pnpn semiconductor device is described on pages 679 to 681 of "Appl. Phys. Lett. 52(9), 29 February 1988". This pnpn semiconductor device comprises p- and n-outside semiconductor layers corresponding to anode and cathode layers, and p- and n-inside semiconductor layers sandwiched by the p- and n-outside semiconductor layers, wherein bandgap energies of the p- and n-outside semiconductor layers are larger than those of the p- and n-inside semiconductor layers, so that light is emitted with a high efficiency from the pnpn semiconductor device in the low impedance state.

This kind of a pnpn semiconductor device is applied to an optical memory, an optical logic circuit, etc. For this purpose, a voltage slightly lower than a switching voltage is applied to the pnpn semiconductor device which is then triggered by an input light, so that the pnpn semiconductor device is shifted from the high impedance state to the low impedance state to emit an output light. This is a stage at which information is written. This low impedance state is held in the pnpn semiconductor device, to which a voltage slightly higher than a holding voltage is applied. This is a stage at which the written information is held. Then, a read out voltage slightly lower than the switching voltage is applied to the pnpn semiconductor device to emit an output light. This is a stage at which the written information is read out. The information is erased by applying a voltage slightly lower than zero voltage to the pnpn semiconductor device. This is a stage at which the written information is erased.

However, the above described method for driving a pnpn semiconductor device has a disadvantage in that a light energy which is required for shifting the pnpn semiconductor device to the low impedance state is considerably large. In the pnpn semiconductor device as described in the aforementioned Appl. Phys., the required light energy is 1pJ. Consequently, a light energy of 100 μ W is necessary to turn the pnpn semiconductor device on by a switching speed of 10nS (equivalent to 100 Mb/s). This value of the light energy is a considerably large value in view of an intensity of light emitted from light emitting diodes and semiconductor lasers presently available.

SUMMARY OF THE INVENTION

Accordingly, it is an object of the invention to provide a method for driving a pnpn semiconductor device in which a light energy required for turning the pnpn semiconductor device on is lowered.

According to the invention, a method for driving a pnpn semiconductor device, comprises:

applying an electric pulse having a predetermined voltage higher than a switching voltage and a predetermined width across the pnpn semiconductor device which is in the state of a high impedance, the predetermined width being set not to shift the pnpn semiconductor device to the state of a low impedance; and supplying a trigger light having a predetermined intensity and a predetermined width to the pnpn semiconductor device across which the electric pulse is applied, thereby shifting the pnpn semiconductor device to the state of the low impedance in cooperation with the application of the electric pulse.

BRIEF DESCRIPTION OF THE DRAWINGS

The invention will be described in more detail in conjunction with appended drawings, wherein:

FIGS. 9A to 9C and 10A to 10C are timing charts showing the method for driving the pnpn semiconductor device in the second and third embodiments according to the invention.

DESCRIPTION OF THE PREFERRED EMBODIMENTS

Before explaining a method for driving a pnpn semiconductor device in a preferred embodiment according to the invention, the aforementioned conventional driving method will be explained in FIGS. 1 to 3.

Figure 1:
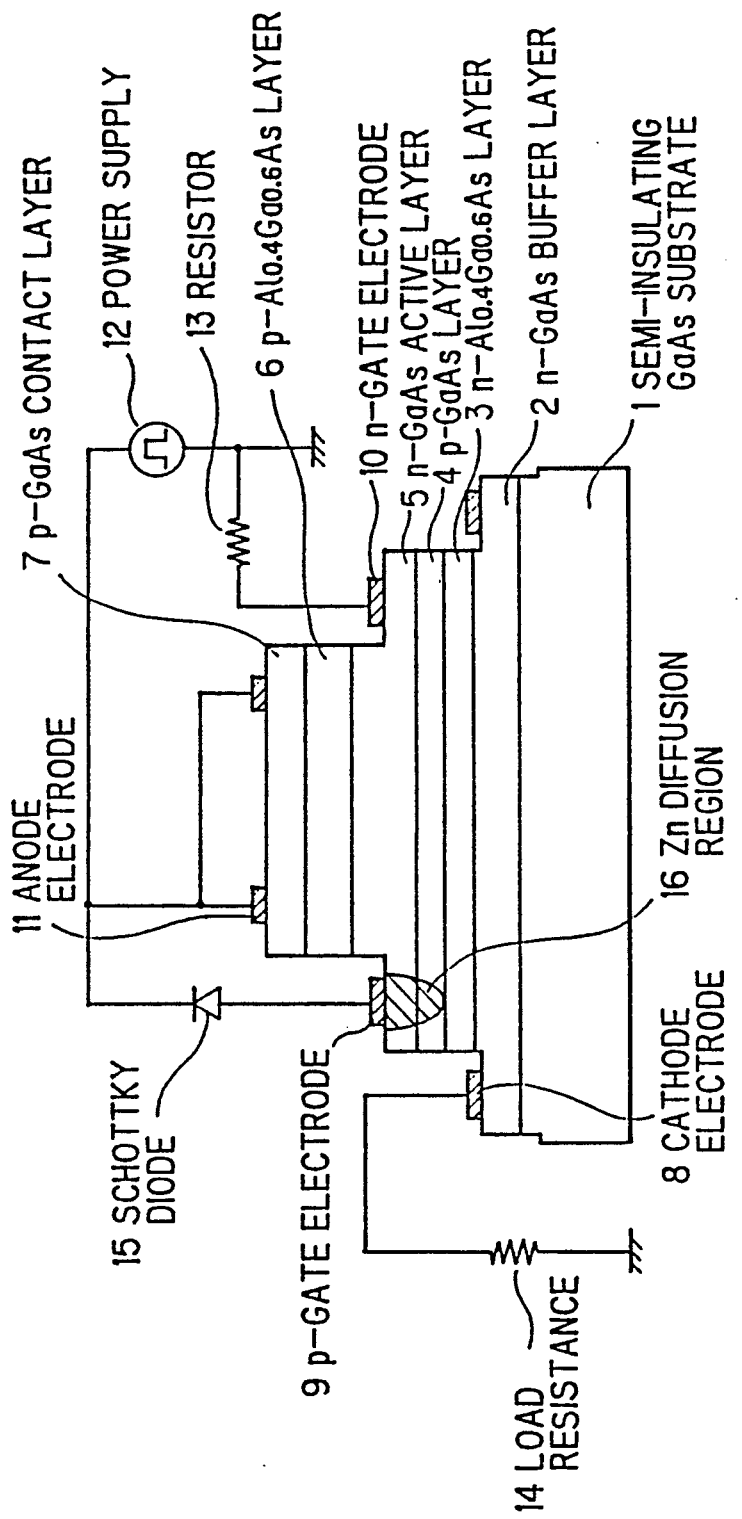
FIG. 1 is a circuitry diagram showing a pnpn semiconductor device and a conventional method for driving the same.

FIG. 1 shows the pnpn semiconductor device, which is described in the Appl. Phys., comprising a semi-insulating GaAs substrate 1, and an n-GaAs buffer layer 2 having a thickness of 0.5 μ m and a carrier concentration of $2 \times 10^{18} cm^{-3}$, an n-Al$_{0.4}$Ga$_{0.6}$As layer 3 having a thickness of 1 μ m and a carrier concentration of $5 \times 10^{17} cm^{-3}$, a p-GaAs layer 4 having a thickness of 50Å and a carrier concentration of $1 \times 10^{19} cm^{-3}$, an n-GaAs active layer 5 having a thickness of 1 μ m and a carrier concentration of $1 \times 10^{17} cm^{-3}$, a p-Al$_{0.4}$Ga$_{0.6}$As layer 6 having a thickness of 0.5 μ m and a carrier concentration of $5 \times 10^{19} cm^{-3}$, and a p-GaAs contact layer 7 having a thickness of 0.15 μ m and a carrier concentration of $1 \times 10^{19} cm^{-3}$ successively grown on the semi-insulating GaAs substrate 1 by molecular beam epitaxy. The pnpn semiconductor device further comprises an anode electrode 11 provided on the contact layer 7, a cathode electrode 8 provided on the n-GaAs buffer layer 2, a p-gate electrode 9 provided on a region 16 diffused with Zn into the p-GaAs layer 4 and the n-GaAs active layer 5, and an n-gate electrode 10 provided on the n-GaAs active layer 5. In the pnpn semiconductor device, a power supply 12 is connected to the anode electrode 11, and through a schottky diode 15 to the p-gate electrode 9, the n-gate electrode 10 is connected through a resistor 13 to the ground, and the cathode electrode 8 is connected through a load resistance 14 to the ground.

Figure 2:
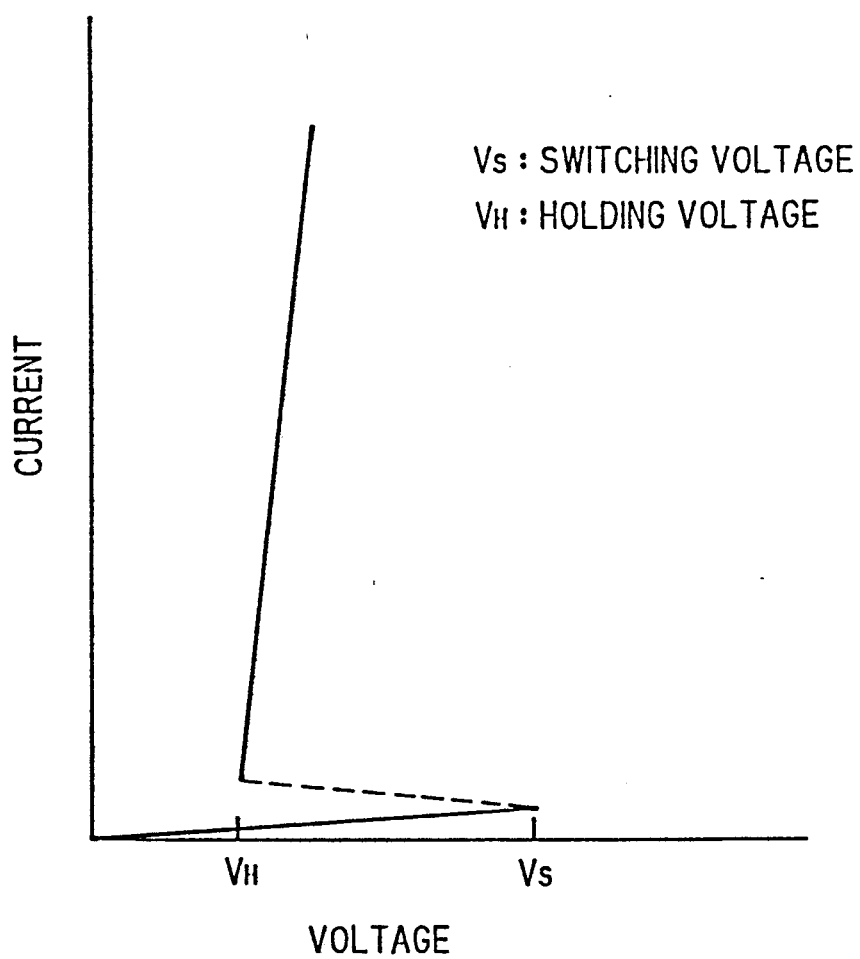
FIG. 2 is an explanatory diagram showing a switching characteristic of the pnpn semiconductor device shown in FIG. 1, FIGS. 3A to 3C are timing charts showing the conventional method for driving the pnpn semiconductor device.

FIG. 2 shows a switching characteristic of the pnpn semiconductor device in which the pnpn semiconductor device is turned on by the application of a switching voltage $V_s$ thereto, so that the pnpn semiconductor device is shifted from the high impedance state to the low impedance state which is maintained by the application of a voltage larger than a holding voltage $V_H$ thereto.

Figure 3A:
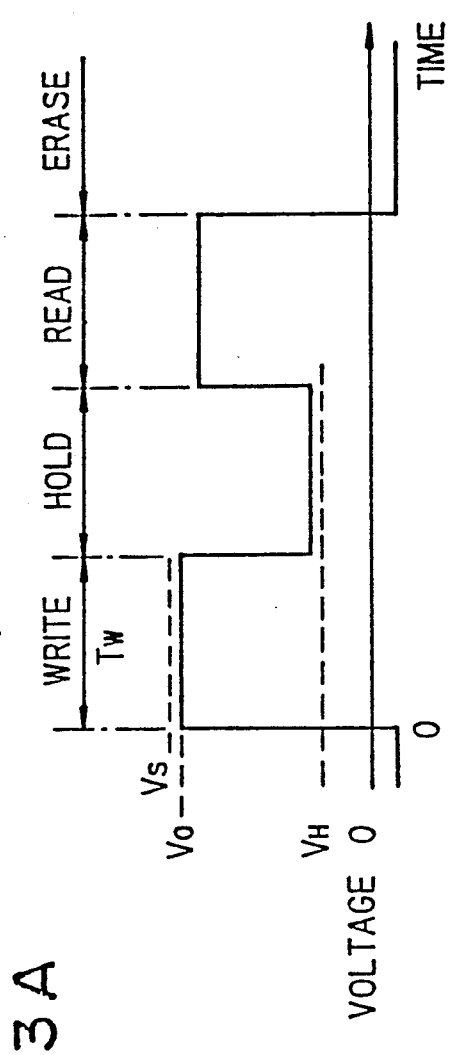
Figure 3B:
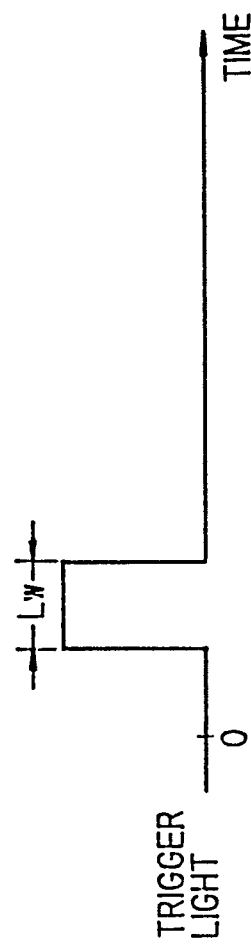
Figure 3C:
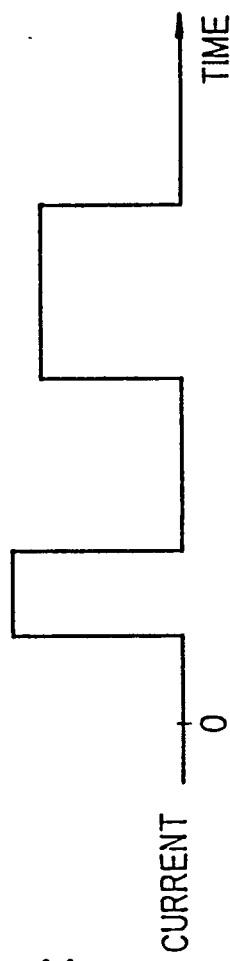

In the conventional method for driving the pnpn semiconductor device, a voltage $V_0$ slightly lower than the switching voltage $V_s$ is applied across the anode and cathode electrodes 11 and 8 for a time duration $T_2$, as shown in FIG. 3A. In the latter part of the duration $T_w$, a trigger light having a width $L_w$ is supplied to the pnpn semiconductor device, as shown in FIG. 3B. Consequently, the pnpn semIoonduolor device is turned on to be the low impedance state, so that a response current flows through the pnpn semiconductor device, and an output light is emitted therefrom, as shown in FIG. 3C. Thus, the trigger light is written into the pnpn semiconductor device as an input information. The voltage $V_0$ is controlled to be lowered to a voltage slightly larger than the holding voltage $V_H$, as shown in FIG. 3A, so that the low impedance state is maintained to hold the input information, as understood from the switching characteristic of FIG. 2. Then, the voltage $V_0$ slightly lower than the switching voltage $V_s$ is applied to the pnpn semiconductor device to read the input information therefrom in the form of a response current and an output light, as shown in FIGS. 3A and 3C. The stored information is erased by lowering the voltage $V_0$ to a voltage lower than zero voltage, as shown in FIG. 3C. In FIG. 1, the resistor 13 and the schottky diode 15 act as a bypass for the internal excess carriers.

Next, a method for driving a pnpn semiconductor device in the preferred embodiment will be explained.

Figure 4:
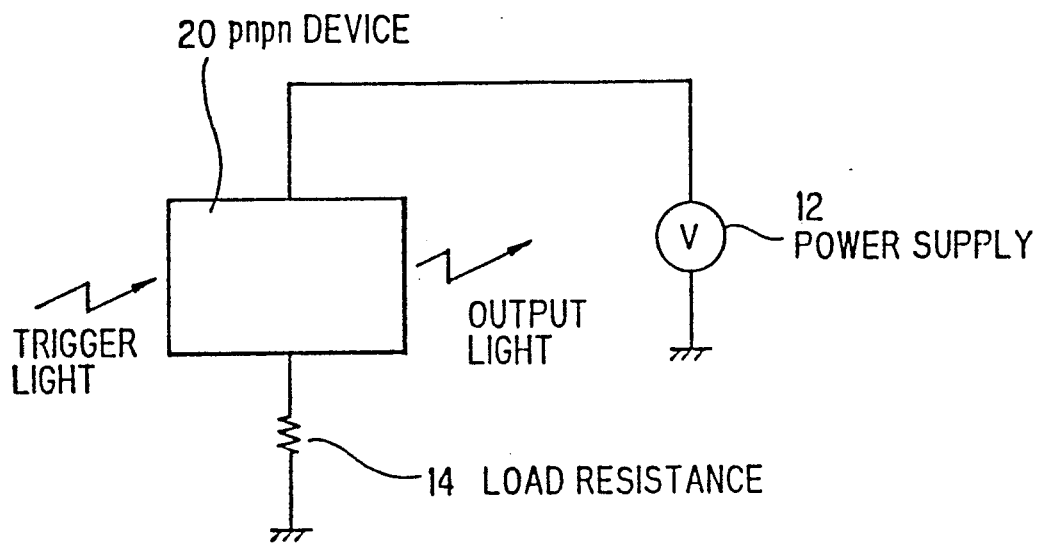
FIG. 4 is a circuitry diagram showing a method for driving a pnpn semiconductor device in first to third embodiments according to the invention.

FIG. 4 shows a simplified circuitry structure, in which a method for driving a pnpn semiconductor device is carried out, comprising a pnpn semiconductor device 20 having the same structure as that of FIG. 1, a power supply 12 for applying a voltage across the pnpn semiconductor device 20, and a load resistance 14 positioned between the pnpn semiconductor device 20 and the ground.

Figure 5A:
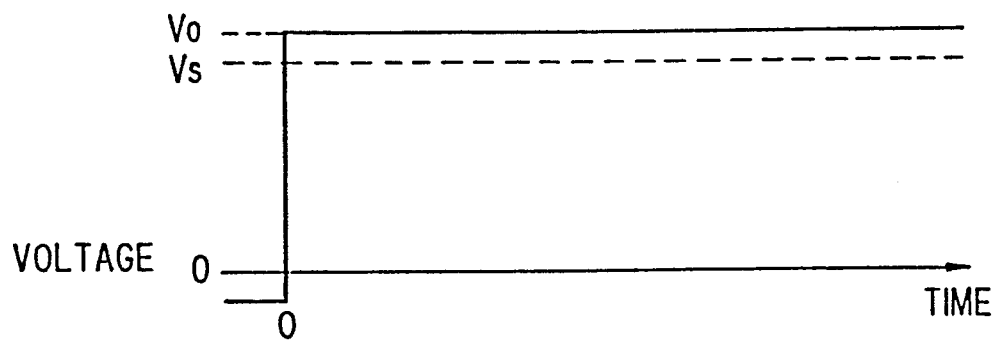
FIGS. 5A and 5B are timing charts showing a switching delay time of the pnpn semiconductor device.
Figure 5B:
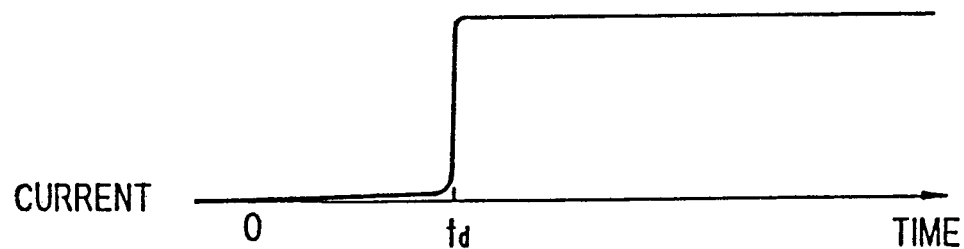

The inventors have confirmed that, where a voltage $V_0$ slightly higher than the switching voltage $V_s$ is applied across the pnpn semiconductor device 20 as shown in FIG. 5A, the pnpn semiconductor device 20 is turned on to be the low impedance state with a switching delay time $t_d$ as shown in FIG. 5B.

Figure 6:
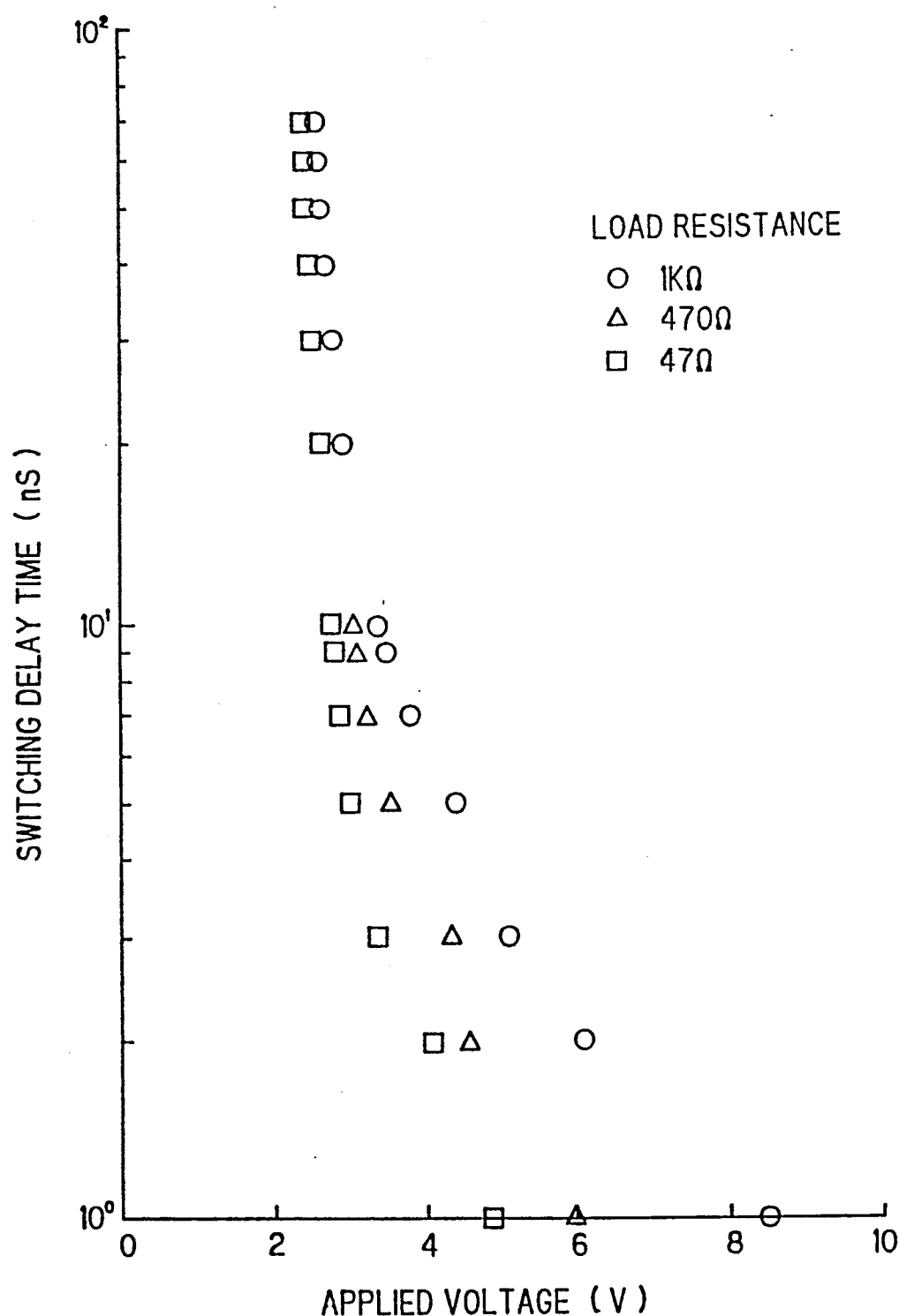
FIG. 6 is a graph showing relations between applied voltages and switching delay times on the pnpn semiconductor device.

FIG. 6 shows results of the switching delay time $t_d$ which varies dependent on a voltage to be applied across the pnpn semiconductor device 20 having a switching voltage $V_s$ of 2V. A load resistance 14 which is selected from resistors having resistance values 1kΩ, 470 Ω and 47 Ω is inserted between the pnpn semiconductor device 20 and the ground. As the resistance value of the load resistance 14 becomes large, a changing rate of the switching delay time $t_d$ becomes large dependent on an applied voltage. As the applied voltage becomes large, the switching delay time $t_d$ becomes small.

Figures 7A, 7B, 7C:
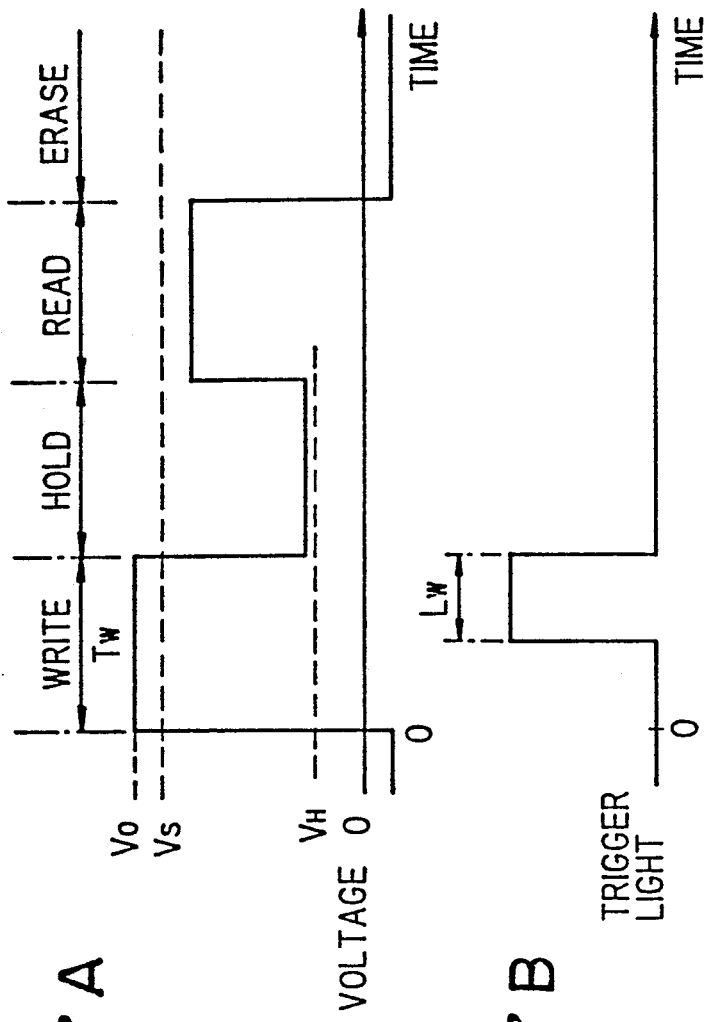
FIGS. 7A to 7C are timing charts showing the method for driving a pnpn semiconductor device in the first embodiment according to the invention.

In a method for driving a pnpn semiconductor device in the first embodiment according to the invention, a voltage $V_0$ higher than the switching voltage $V_s$ is applied across the pnpn semiconductor device 20 for a time duration $T_w$ which is smaller than the switching delay time $t_d$, as shown in FIG. 7A, so that carriers are accumulated in the pnpn semiconductor device 20. Then, a trigger light having a width $L_w$ much smaller than the conventional width $L_w$ of FIG. 3B is supplied to the pnpn semiconductor device 20, as shown in FIG. 7B, so that the pnpn semiconductor device 20 is turned on to be the low impedance state, in which a response current flows through the pnpn semiconductor device 20 and an output light is emitted therefrom, as shown in FIG. 7C. Therefore, a light energy required for turning the pnpn semiconductor device 20 on is much decreased in the invention, as compared to the conventional method in which a pnpn semiconductor device is turned on substantially only by a trigger light in the condition that a voltage $V_0$ applied across the pnpn semiconductor device is lower than the switching voltage $V_s$. Then, the applied voltage $V_0$ is lowered to a voltage slightly higher than the holding voltage $V_H$, as shown in FIG. 7A, so that the low impedance state is maintained to store information of the trigger light. In FIG. 7C, a time $t_R$ at which the writing of the information is finished is earlier than a time $t_d$ at which the aforementioned switching delay time $t_d$ ends, so that a switching speed can be fast with a smaller light energy by a duration $\tau(=t_d-t_R)$. In practical, the load resistance 14 is 1k Ω, and the information writing duration $T_w$ is 10nS, the duration $\tau$ is obtained to be 2nS in the condition that the applied voltage $V_0$ is 3.1 V, and thus, the switching delay time $t_d$ is 12nS. In this circumstance, the light energy for turning the pnpn semiconductor device on is 50fJ, where the width $L_w$ of the trigger light is 3nS. On the contrary, the switching light energy is 1pJ in the conventional method in which the applied voltage $V_0$ is set to be smaller than the switching voltage $V_s$ as shown in FIG. 3. This means that the switching light energy is decreased in the invention to be one-twentieth of that required in the conventional method. The stored information is read out of the pnpn semiconductor device 20 at the reading-out stage by applying a voltage slightly lower than the switching voltage $V_s$, as shown in FIG. 7A. The read out information is in the form of a response current, as shown in FIG. 7C, and an output light emitted from the pnpn semiconductor device 20. The stored information can be erased by applying a voltage lower than zero voltage to the pnpn semiconductor device 20, as shown in FIG. 7A.

Figure 8:
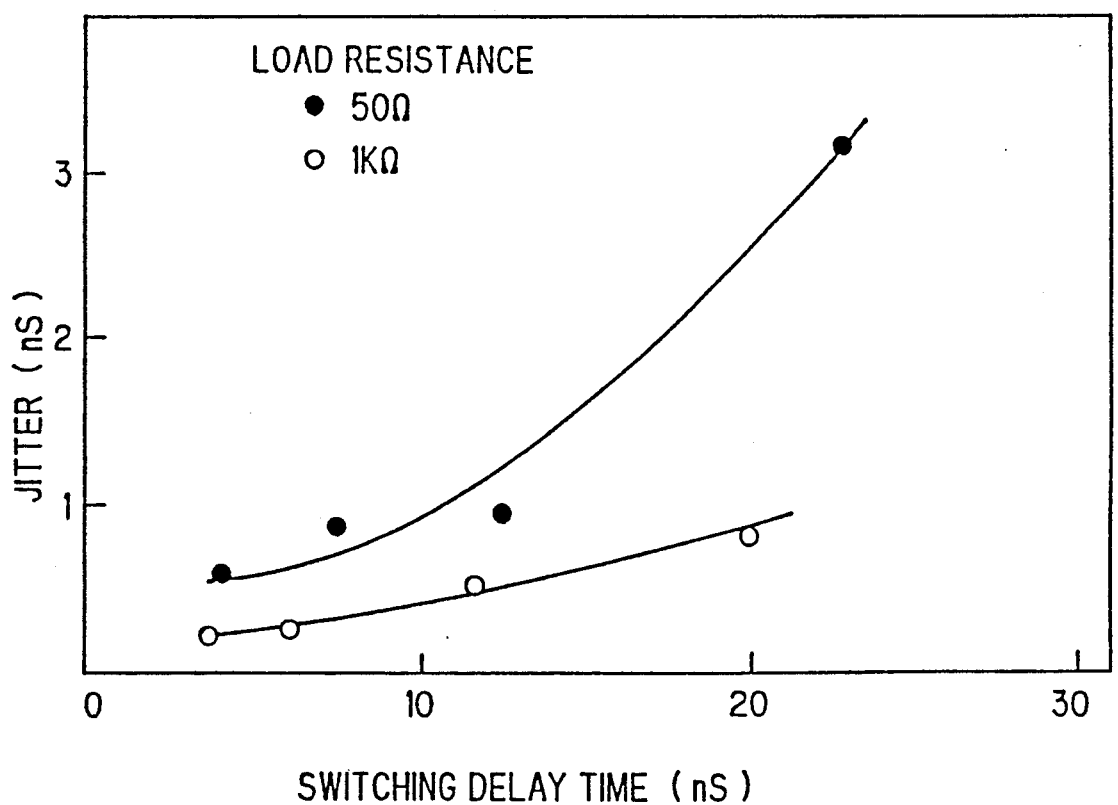
FIG. 8 is a graph showing relations between the switching delay times and jitters on the pnpn semiconductor device.

Jitter dependent on a switching delay time $t_d$ is shown in FIG. 8, wherein the jitter which is superposed on a response current flowing through the pnpn semiconductor device at its rising up is approximately 0.5nS in width, where the switching delay time $t_d$ is 12nS. Therefore, the aforementioned time difference $\tau$ is stably set to be 2nS($\tau=2$nS).

Figure 9A:
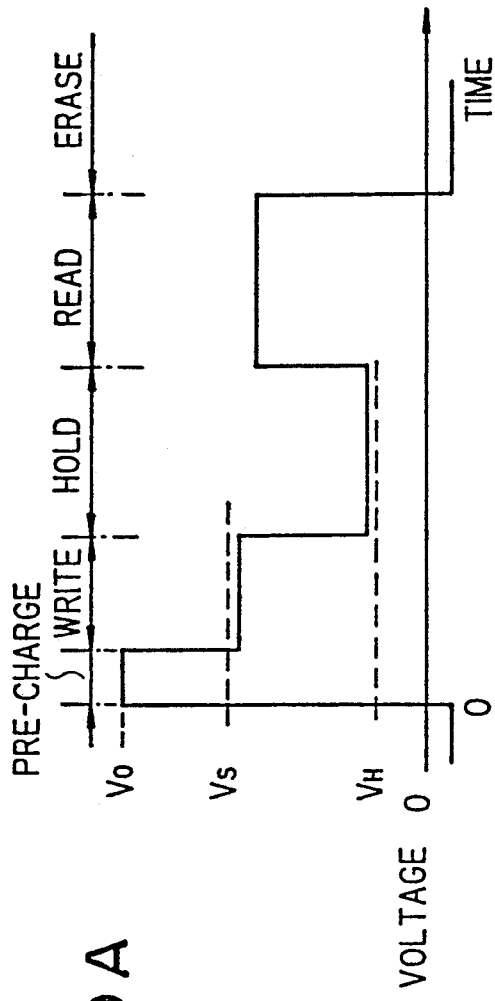
Figure 9B:
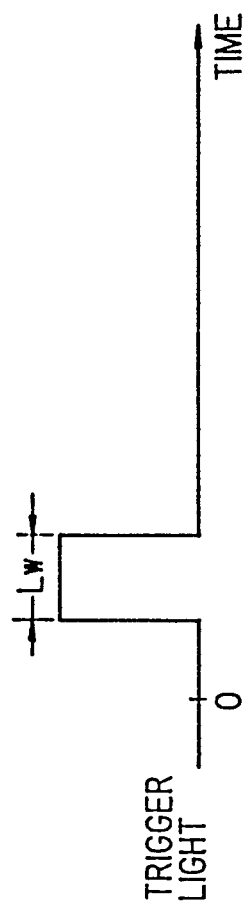
Figure 9C:
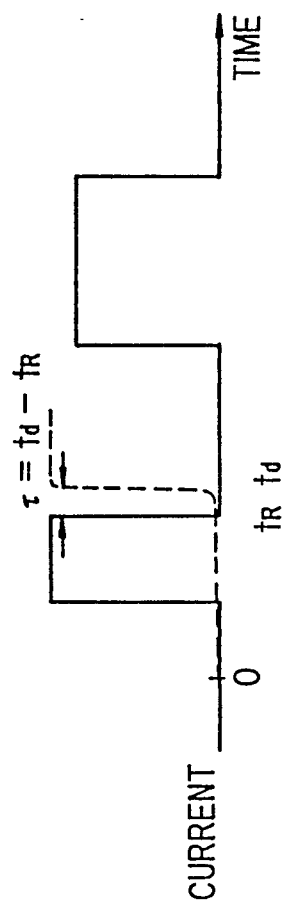

FIGS. 9A to 9C show a method for driving a pnpn semiconductor device in a second embodiment according to the invention, wherein a pre-charging stage is conducted before the writing stage is carried out. In more detail, a voltage $V_0$ much higher than the switching voltage $V_s$ is applied across the pnpn semiconductor device 20 for 0.5nS at the pre-charging stage, and the applied voltage $V_0$ is then decreased to a voltage slightly lower than the switching voltage $V_s$ for 9.5nS at the writing stage, as shown in FIG. 9A. At the latter part of the writing stage, a trigger light is supplied to the pnpn semiconductor device 20 for 3nS, as shown in FIG. 9B, so that the pnpn semiconductor device 20 is turned on to provide a response current and emit an output light, as shown in FIG. 9C. In this second embodiment, the applied voltage $V_0$ is set to be 8V to result in the time difference $\tau$ of 2nS($\tau$=2nS). Consequently, the light energy of the trigger light is 50fJ, the same value as that of the first embodiment. The holding, reading out, and erasing stages are carried out in the same manner as the first embodiment.

FIGS. 10A to 10C show a method for driving a pnpn semiconductor device in a third embodiment according to the invention, wherein first and second pre-charging stages are conducted before the writing stage is carried out. In more detail, a voltage of 8.5V which is much larger than the switching voltage $V_s$ is applied across the pnpn semiconductor device 20 for 1nS at the first pre-charging stage to turn the pnpn semiconductor device 20 on, as shown in FIGS. 10A and 10C, and then decreased to a voltage of $-0.5$V for 1nS at the second pre-charging stage to turn the pnpn semiconductor device 20 off, as shown in FIGS. 10A and 10C. Although the pnpn semiconductor device 20 is in the high impedance state at the second pre-charging stage, carries are confined in the pnpn semiconductor device 20 to some extent. Thereafter, a voltage $V_0$ of 3.9V which is slightly lower than the switching voltage $V_s$ is applied across the pnpn semiconductor device 20 for 8nS at the writing stage. At this stage, the trigger light is supplied to the pnpn semiconductor device 20 for 3nS to be turned on, as shown in FIGS. 10A to 10C. In the third embodiment, the light energy of the trigger light is decreased by one digit, as compared to the conventional method. The holding, reading out and erasing stages are carried out in the same manner as the first and second embodiments.

In the first to third embodiments, the switching light energy is greatly decreased as explained above.

In the first embodiment, the most important thing is that a voltage higher than a switching voltage is applied across a pnpn semiconductor. Where such a voltage is constantly applied across the pnpn semiconductor device, the pnpn semiconductor device is turned on with a switching delay time to shift from the high impedance state to the low impedance state. Thus, the voltage is applied across the pnpn semiconductor device for a time duration less than the switching delay time, so that electrons and holes are injected into the pnpn semiconductor device in the high impedance state. As a result, a light energy required for turning the pnpn semiconductor device on can be decreased as compared to the conventional method.

In the second embodiment, a first voltage much higher than the switching voltage and a second voltage slightly lower than the switching voltage are successively applied across the pnpn semiconductor device, and a trigger light is supplied to the pnpn semiconductor device, to which the second voltage is applied thereacross, to turn the pnpn semiconductor device on. Before turning the pnpn semiconductor device on, electrons and holes are injected into the pnpn semiconductor device to be pre-charged therein by applying the first voltage thereto. This results in the reduction of a light energy required for turning the pnpn semiconductor device on. As a matter of course, it must be avoided that the pnpn semiconductor device is turned on without a trigger light in the application of the first and second voltages.

In the comparison between the first and second embodiments, the first embodiment is advantageous over the second one in that the control of voltages is easier in the former than in the latter. On the other hand, the second embodiment is advantageous over the first embodiment with respect to the control of precharging effect. In this point, although the precharging amount of carriers is decided by a voltage value and a pulse width of an applied voltage, the pulse width is easier to be controlled than the voltage value. Therefore, the voltage value of the first voltage is made higher in the second embodiment, and the pulse width thereof is made narrower therein, so that the control of an applied voltage is less affected in voltage value by a voltage fluctuation in the second embodiment than in the first embodiment.

In the third embodiment, a pnpn semiconductor device is once turned on without a trigger light by applying a voltage much higher than a switching voltage thereto, so that carriers are accumulatd in the pnpn semiconductor device. Thereafter, the pnpn semiconductor device is turned off by decreasing the applied voltage to a voltage much lower than the switching voltage, and then turned on by supplying a trigger light thereto in the state that a major portion of the accumulated carriers are left in the pnpn semiconductor device.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for driving a pnpn semiconductor device, comprising:

applying an electric pulse having a predetermined voltage higher than a switching voltage and a predetermined width across said pnpn semiconductor device which is in the state of a high impedance, said predetermined width being set not to shift said pnpn semiconductor device to the state of a low impedance; and supplying a trigger light having a predetermined intensity and a predetermined width to said pnpn semiconductor device across which said electric pulse is applied, thereby shifting said pnpn semiconductor device to said state of said low impedance in cooperation with the application of said electric pulse.

2. A method for driving a pnpn semiconductor device, comprising:

applying a first electric pulse having a first predetermined voltage higher than a switching voltage and a first predetermined width across said pnpn semiconductor device which is in the state of a high impedance, said predetermined width being set not to shift said pnpn semiconductor device to the state of a low impedance state;

applying a second electric pulse having a second predetermined voltage lower than said switching voltage and a second predetermined width across said pnpn semiconductor device after the application of said first electric pulse; and supplying a trigger light having a predetermined intensity and predetermined width to said pnpn semiconductor device across which said second electric pulse is applied, thereby shifting said pnpn semiconductor device to said state of said low impedance in cooperation with the application of said first and second electric pulses.

3. A method for driving a pnpn semiconductor device, comprising:

applying a first electric pulse having a first predetermined voltage higher than a switching voltage and a first predetermined width across said pnpn semiconductor device which is in the state of a high impedance, thereby shifting said pnpn semiconductor device to the state of a low impedance;

applying a second electric pulse having a second predetermined voltage lower than said switching voltage and a second predetermined width across said pnpn semiconductor device which is in said state of said low impedance, thereby shifting said pnpn semiconductor device back to said state of said high impedance; and supplying a trigger light having a predetermined intensity and a predetermined width to said pnpn semiconductor device across which said second electric pulse is applied, thereby shifting said pnpn semiconductor device to said state of said low impedance in cooperation with the application of said first electric pulse.

* * * * *